(12) United States Patent
Ball et al.

(10) Patent No.: US 6,786,387 B2
(45) Date of Patent: Sep. 7, 2004

(54) METHOD FOR CLAMPING AND WIRE-BONDING THE LEADS OF A LEAD FRAME ONE SET AT A TIME

(75) Inventors: Michael B. Ball, Boise, ID (US); Rich Fogal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/206,291

(22) Filed: Jul. 25, 2002

(65) Prior Publication Data

US 2002/0179691 A1 Dec. 5, 2002

Related U.S. Application Data

(63) Continuation of application No. 09/944,470, filed on Aug. 30, 2001, now Pat. No. 6,467,672, which is a continuation of application No. 09/366,817, filed on Aug. 4, 1999, now Pat. No. 6,299,049, which is a continuation of application No. 08/763,366, filed on Dec. 13, 1996, now Pat. No. 6,068,174.

(51) Int. Cl.[7] .............................................. B23K 31/02
(52) U.S. Cl. ..................... 228/103; 228/4.5; 228/180.5; 228/212; 73/827
(58) Field of Search ................................. 228/4.5, 44.7, 228/104, 180.5, 212, 213, 1.1, 110.1, 9; 73/826, 827, 841, 842

(56) References Cited

U.S. PATENT DOCUMENTS

| | | |
|---|---|---|
| 3,685,137 A | 8/1972 | Gardiner |
| 3,887,998 A | 6/1975 | Hartleroad et al. |
| 3,937,386 A | 2/1976 | Hartleroad et al. |
| 3,960,279 A | 6/1976 | Hartleroad et al. |
| 4,030,657 A | 6/1977 | Scheffer |
| 4,361,261 A | 11/1982 | Elles et al. |
| 4,434,347 A | 2/1984 | Kurtz et al. |
| 4,527,730 A | 7/1985 | Shirai et al. |
| 4,600,138 A | 7/1986 | Hill |
| 4,603,803 A | 8/1986 | Chan et al. |
| 4,653,681 A | 3/1987 | Dreibelbis et al. |
| 4,765,531 A | 8/1988 | Ricketson et al. |
| 4,778,097 A | 10/1988 | Hauser |
| 4,821,945 A | 4/1989 | Chase et al. |
| 4,862,245 A | 8/1989 | Pashby et al. |
| 4,891,687 A | 1/1990 | Mallik et al. |
| 4,943,843 A | 7/1990 | Okinaga et al. |
| 5,035,034 A | 7/1991 | Cotney |
| 5,062,565 A | 11/1991 | Wood et al. |
| 5,114,066 A | 5/1992 | Amador et al. |
| 5,148,959 A | 9/1992 | Cain et al. |
| 5,193,733 A | 3/1993 | You |
| 5,197,652 A | 3/1993 | Yamazaki |
| 5,217,154 A | 6/1993 | Elwood et al. |
| 5,251,805 A | 10/1993 | Tani et al. |
| 5,291,061 A | 3/1994 | Ball |
| 5,307,978 A | 5/1994 | Ricketson et al. |

(List continued on next page.)

FOREIGN PATENT DOCUMENTS

| | | |
|---|---|---|
| JP | 60-195945 | 10/1985 |
| JP | 61-190951 | 8/1986 |
| JP | 63-86538 | 4/1988 |

OTHER PUBLICATIONS

H.K. Charles, Jr., *Electrical Interconnection*, pp. 224–236 (no date available).

*Primary Examiner*—Kiley Stoner
(74) *Attorney, Agent, or Firm*—TraskBritt

(57) ABSTRACT

A wire-bonding machine includes a heat block for supporting a lead frame during wire-bonding. A clamp mechanism in the machine clamps leads of the lead frame during wire-bonding by fixedly holding sets of the leads against the heat block one set at a time. A wire-bonding tool wire-bonds leads clamped by the clamp mechanism to bond pads on an integrated circuit die. By clamping leads of the lead frame in separate sets, the machine provides improved clamping for lead frames with leads requiring clamping in different planes.

17 Claims, 7 Drawing Sheets

U.S. PATENT DOCUMENTS

| | | |
|---|---|---|
| 5,322,207 A | 6/1994 | Fogal et al. |
| 5,331,200 A | 7/1994 | Teo et al. |
| 5,350,106 A | 9/1994 | Fogal |
| 5,384,155 A | 1/1995 | Abbott et al. |
| 5,421,503 A | 6/1995 | Perlberg et al. |
| 5,425,491 A | 6/1995 | Tanaka et al. |
| 5,445,306 A | 8/1995 | Huddleston |
| 5,465,899 A | 11/1995 | Quick et al. |
| 5,486,733 A | 1/1996 | Yamazaki et al. |
| 5,497,031 A | 3/1996 | Kozono |
| 5,497,032 A | 3/1996 | Tsuji et al. |
| 5,513,792 A | 5/1996 | Onitsuka |
| 5,516,023 A | 5/1996 | Kono |
| 5,591,920 A | 1/1997 | Price et al. |
| 5,647,528 A | 7/1997 | Ball et al. |
| 5,673,845 A | 10/1997 | Ball |
| 5,813,590 A | 9/1998 | Fogal et al. |
| 5,826,778 A | 10/1998 | Sato et al. |
| 5,890,644 A | 4/1999 | Ball |
| 5,894,981 A | 4/1999 | Kelly |
| 5,904,288 A | 5/1999 | Humphrey |
| 5,954,842 A | 9/1999 | Fogal et al. |
| 6,000,599 A | 12/1999 | Ball et al. |
| 6,047,468 A | 4/2000 | Fogal et al. |
| 6,047,877 A | 4/2000 | Ball |
| 6,068,174 A | 5/2000 | Ball et al. |
| 6,299,049 B1 | 10/2001 | Ball et al. |
| 6,334,566 B1 | 1/2002 | Ball et al. |
| 6,478,211 B2 * | 11/2002 | Ball et al. .................. 228/4.5 |

* cited by examiner

US 6,786,387 B2

METHOD FOR CLAMPING AND WIRE-BONDING THE LEADS OF A LEAD FRAME ONE SET AT A TIME

CROSS-REFERENCE TO RELATED APPLICATIONS

This application is a continuation of application Ser. No. 09/944,470, filed Aug. 30, 2001, now U.S. Pat. No. 6,467,672, issued Oct. 22, 2002, which is a continuation of application Ser. No. 09/366,817, filed Aug. 4, 1999, now U.S. Pat. No. 6,299,049 B1, issued Oct. 9, 2001, which is a continuation of application Ser. No. 08/763,366, filed Dec. 13, 1996, now U.S. Pat. No. 6,068,174, issued May 30, 2000.

BACKGROUND OF THE INVENTION

1. Field of the Invention

The present invention relates to devices and methods for clamping the leads of a lead frame while the leads are being wire-bonded to bond pads on an integrated circuit die.

2. State of the Art

Integrated circuit (IC) dice or "chips" are small, generally rectangular IC devices cut from a semiconductor wafer, such as a silicon wafer, on which multiple ICs have been fabricated. IC dice are typically packaged to protect them from corrosion by attaching them to lead frames using a solder or epoxy, electrically connecting them to leads in the lead frames, and then encapsulating the resulting die and lead frame assemblies in plastic die packages. The leads in the encapsulated lead frames protrude from the die packages and terminate in pins so the dice electrically connected to the leads can communicate with circuitry external to the die packages through the pins.

IC dice are typically electrically connected to the leads in their associated lead frames in a process known as "wire-bonding." During wire-bonding of an IC die to a lead frame, a wire-bonding tool, such as an ultrasonic, thermosonic, or thermo-compression tool, bonds lengths of fine wire to bond pads on the die and to bonding sites on the leads in the lead frame in order to connect the bond pads and the leads. This process is well-known, and is described in detail in U.S. Pat. Nos. 4,030,657, 4,361,261, 4,527,730, 4,600,138, 4,603,803, 4,765,531, 4,778,097, 5,148,959, 5,217,154, 5,251,805, 5,307,978, 5,421,503, 5,425,491, 5,445,306, 5,465,899, 5,486,733, 5,513,792, and 5,516,023.

In order to ensure proper wire-bonding, lead frame leads are typically clamped during wire-bonding to stabilize them so a solid bond can be formed between the leads and the fine wire used to wire-bond them to an IC die. Without clamping, the leads can move during wire-bonding and cause unreliable bonds to be formed between the leads and the fine wire.

Conventionally, all the leads in a lead frame are clamped at once in a single plane during wire-bonding, as shown in U.S. Pat. Nos. 3,685,137, 5,035,034, and 5,193,733. By clamping all the leads of a lead frame at once, the conventional clamping method holds to a relative minimum the time it takes to wire-bond an IC die to the lead frame.

While holding wire-bonding time to a minimum is advantageous, the conventional clamping method can also be problematic with certain lead frames. For example, some lead frames, such as the Leads-Over-Chip lead frame shown in U.S. Pat. No. 4,862,245, have leads which extend closer to the bond pads of IC dice attached to the lead frames than other leads such that fine wires bonded between the IC dice and these other leads must arch over the leads which are closer to the bond pads on the dice. Since fine wires must arch over the leads closer to the bond pads, the closer leads cannot be clamped at the same time all the other leads are clamped. Instead, the closer leads conventionally remain unclamped, or only partially clamped, during wire-bonding, resulting in potentially unreliable bonds to those leads.

Also, because the conventional clamping method clamps all the leads of a lead frame at once in a single plane, it cannot adequately clamp leads of a lead frame which must be clamped in different planes. For example, as shown in U.S. Pat. No. 4,943,843, some Tape-Under-Frame lead frames have leads which extend underneath an IC die and then project beyond the footprint of the die so they may be wire-bonded to bond pads on the die. These leads are typically left unclamped during wire-bonding, because they are not clampable in accordance with the conventional clamping method in the same plane as the remainder of the leads. As a result, these leads have potentially unreliable wire-bonds. In a similar fashion, the conventional clamping method cannot adequately clamp multi-layer lead frames, such as that shown in U.S. Pat. No. 5,291,061.

Wire-bonding clamps, such as that shown in U.S. Pat. No. 4,821,945, have been developed to alleviate some of the problems of the conventional clamping method by clamping leads individually. However, these clamps can dramatically increase the time it takes to wire-bond an IC die, because the clamp must be sequentially indexed to each individual lead.

Therefore, there is a need in the art for a device and method for clamping lead frame leads during wire-bonding that can clamp leads in different planes without significantly increasing the time it takes to wire-bond an IC die.

SUMMARY OF THE INVENTION

An inventive wire-bonding apparatus includes a base for supporting a lead frame during re-bonding. A clamp mechanism in the apparatus fixedly holds sets of leads of the lead frame against the base one set at a time, with each set including fewer than all the leads and at least one set including more than one of the leads. Also, a wire-bonding tool wire-bonds leads fixedly held against the base by the clamp mechanism to bond pads on an integrated circuit (IC) die. As a result, leads in different planes can be effectively clamped and wire-bonded in separate sets, yet the leads within each set are all clamped at the same time, so the wire-bonding time for an IC die is kept to a minimum.

Further embodiments include a clamping apparatus which includes the base and clamp mechanism described above and the clamp mechanism described above by itself.

In an additional embodiment, a bonding machine for wire-bonding leads of lead frames in a lead frame strip to bond pads on IC dice attached to the lead frames includes a heat block with a contact area for heating the dice and the lead frames. An indexing mechanism indexes the lead frame strip through the bonding machine so each lead frame in the strip is sequentially indexed to the heat block's contact area. A clamp mechanism fixedly holds sets of the leads of each lead frame indexed to the heat block's contact area against the heat block one set at a time, and a wire-bonding tool wire-bonds the leads in each set held against the heat block to bond pads on the IC die attached to the lead frame of the held leads.

In another embodiment, a bonding machine similar to that described above simultaneously clamps and wire-bonds sequential lead frames in a lead frame strip at multiple contact areas on a heat block.

In a still further embodiment, a bonding machine for wire-bonding leads of a Tape-Under-Frame (TUF) lead frame to bond pads on a front-side surface of an IC die attached to the TUF lead frame includes a heat block for supporting and heating the die and the TUF lead frame. A clamp mechanism fixedly holds a first set of leads of the TUF lead frame, which extends in a plane of a backside surface of the IC die to support the die, and a second set of leads of the TUF lead frame, which extends in the plane of the front-side surface of the IC die, against the heat block one set at a time. Also, a wire-bonding tool wire-bonds the leads in each set of leads fixedly held against the heat block to bond pads on the IC die.

In still another embodiment, a bonding machine for wire-bonding leads of a partial Leads-Over-Chip (LOC) lead frame to bond pads on an IC die includes a heat block for supporting and heating the die and the partial LOC lead frame. A clamp mechanism fixedly holds LOC leads of the partial LOC lead frame against the die, and other leads which terminate proximate the perimeter of the IC die against the heat block, at different times. Also, a wire-bonding tool wire-bonds the fixedly-held leads to bond pads on the IC die.

In yet another embodiment, a bonding machine for wire-bonding bus bar and non-bus bar LOC leads of an LOC lead frame to bond pads on an IC die attached to and supported by the LOC leads includes a heat block for supporting and heating the die and the LOC lead frame. A clamp mechanism fixedly holds the bus bar and non-bus bar LOC leads against the die at different times, and a wire-bonding tool wire-bonds the fixedly-held LOC leads to bond pads on the IC die.

In another additional embodiment, a bonding machine for wire-bonding leads of a lead frame to bond pads on an IC die attached to the lead frame includes a heat block for supporting and heating the die and the lead frame. A clamp mechanism fixedly holds a first set of the leads of the lead frame, which extend toward the die and terminate proximate the die's perimeter in a first plane, and a second set of the leads of the lead frame, which extend toward the die and terminate proximate the die's perimeter in a second plane different than the first, against the heat block at different times. Also, a wire-bonding tool wire-bonds the fixedly-held leads to bond pads on the IC die.

In a further embodiment, a method for clamping leads of a lead frame includes clamping a set of the leads one set at a time with each set including fewer than all the leads and at least one set including more than one of the leads.

In a still further embodiment, a method for wire-bonding leads of lead frames in a lead frame strip to bond pads on IC dice attached to the lead frames includes: sequentially indexing each lead frame in the strip to a clamping position; clamping the leads of each lead frame indexed to the clamping position one set at a time with each set including fewer than all the leads of the lead frame and at least one set including more than one of the leads; and wire-bonding each set of clamped leads to bond pads on the IC die attached to the lead frame of the clamped leads.

DETAILED DESCRIPTION OF THE INVENTION

Figure 1A:
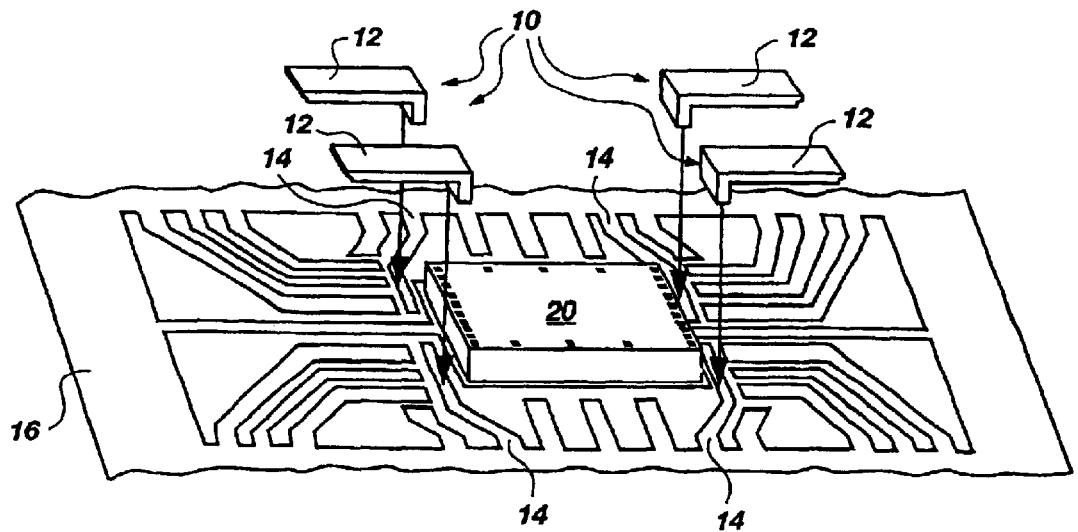
FIGS. 1A and 1B are isometric views of a lead frame clamped and wire-bonded to an integrated circuit (IC) die in accordance with one embodiment of the present invention.

As shown in FIG. 1A, a portion 10 of a clamp mechanism in accordance with the present invention includes a plurality of clamp members 12 moving together as directed by an actuating mechanism (not shown) in a wire-bonding machine (not shown) to fixedly hold a first set of leads 14 of a lead frame 16 against a heat block or other base (not shown) beneath the lead frame 16. Once the leads 14 are fixedly held (i.e., clamped) by the clamp members 12, they may be wire-bonded using a wire-bond tool (not shown) to selected bond pads on a front-side surface of an integrated circuit (IC) die 20 attached to the lead frame 16.

Figure 1B:
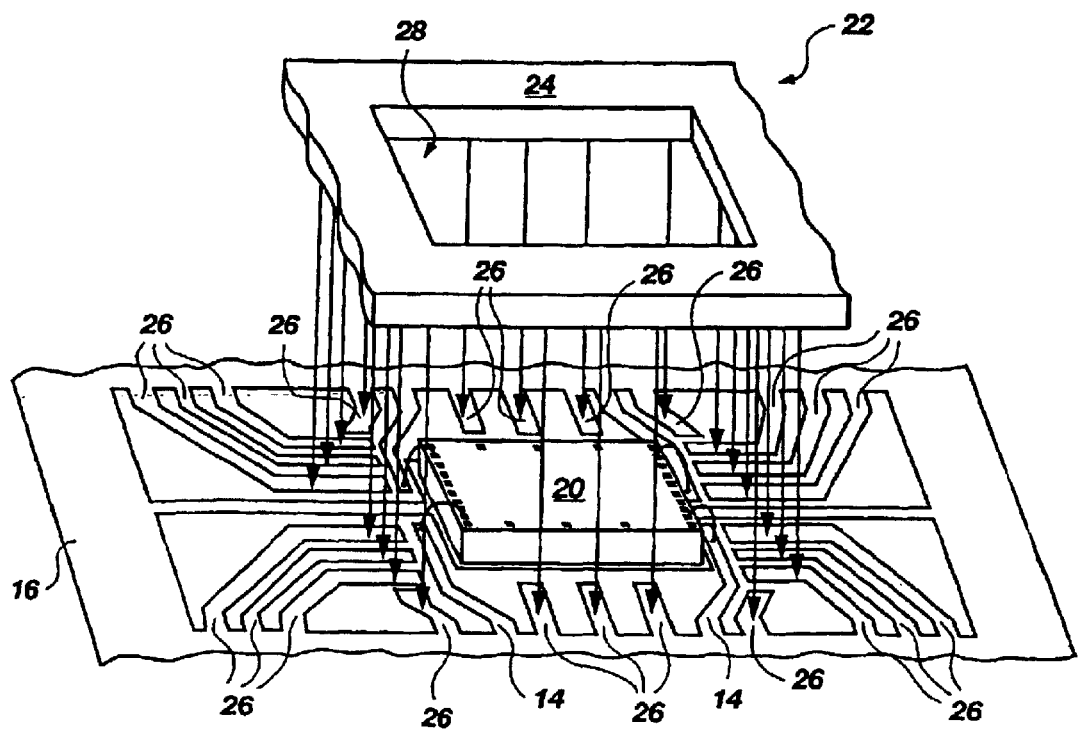

As shown in FIG. 1B, the leads 14 of the lead frame 16 have been wire-bonded to bond pads on the IC die 20 while being clamped as described above and the lead frame 16 has been indexed to a new clamping location with respect to the clamp mechanism of FIG. 1A. Another portion 22 of the clamp mechanism includes a clamp block 24 moving as directed by the actuating mechanism (not shown) of FIG. 1A to fixedly hold a second set of leads 26 of the lead frame 16 against the heat block or other base (not shown) beneath the lead frame 16. Once the leads 26 are fixedly held by the clamp block 24, they may be wire-bonded through a bonding aperture 28 in the clamp block 24 to bond pads on the front-side surface of the IC die 20 using a wire-bond tool (not shown).

By clamping the leads 14 and 26 of the lead frame 16 in separate sets in accordance with the present invention, the leads 14 interposed between the IC die 20 and the leads 26 can be clamped while they are wire-bonded. This is in contrast to the conventional clamping method described above which would only clamp the leads of the lead frame 16 once, and thus would not clamp the leads 14, since to do so while also clamping the leads 26 would interfere with the wire-bonding of the leads 26.

It will be understood by those having skill in the field of this invention that the clamp mechanism of FIGS. 1A and 1B may take a variety of forms, and that the present invention includes within its scope all clamp mechanisms capable of clamping the leads of a lead frame in sets, one set at a time. It will also be understood that the clamp mechanism may comprise a variety of clamp members, including, for example, one or more clamp blocks, as shown in FIG. 1B, or one or more clamp fingers, as described below with respect to FIG. 3B.

It will further be understood that the clamp mechanism may include one or more clamp members for clamping each set of leads in a lead frame, and that each of the plurality of clamp members may individually clamp one or several leads in the set. In addition, it will be understood that, although the present invention will be described with respect to a clamp mechanism clamping the leads of a lead frame in two sets in a particular order, the present invention includes within its scope clamp mechanisms which clamp the leads of a lead frame in more than two sets in any order. Further, it will be understood that the present invention includes within its scope: clamp mechanisms that clamp all the sets of leads of a lead frame at different times but at the same clamping location; clamp mechanisms, such as that described with respect to FIGS. 1A and 1B, that clamp the sets of leads of a lead frame at different times and at different clamping locations; and any combination thereof. It will also be understood that a wide variety of lead frames, including, for example, Leads-Over-Chip (LOC) lead frames and Tape-Under-Frame (TUF) lead frames, and any wire-bondable IC die, will work in conjunction with the present invention.

Figure 2A:
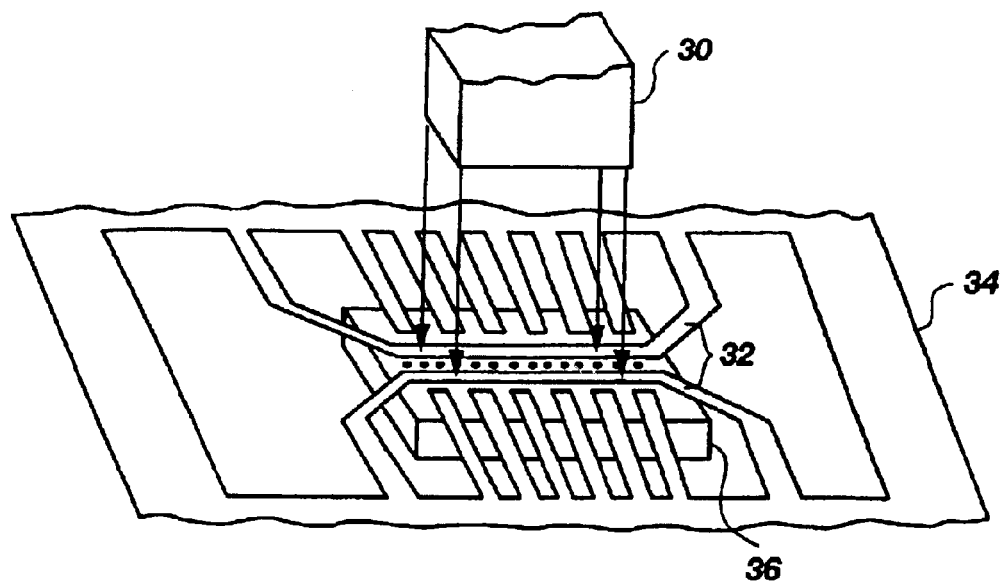
FIGS. 2A and 2B are isometric views of a Leads-Over-Chip (LOC) lead frame clamped and wire-bonded to an IC die in accordance with another embodiment of the present invention.

As shown in FIG. 2A, a portion of a clamp mechanism in accordance with another embodiment of the present invention includes a clamp block 30 moving as directed by an actuating mechanism (not shown) in a wire-bonding machine (not shown) to fixedly hold bus bar LOC leads 32 of a LOC lead frame 34 against an IC die 36 attached to the LOC lead frame 34 and supported by a heat block or other base (not shown). Once the bus bar LOC leads 32 are fixedly held (i.e., clamped) by the clamp block 30, they may be wire-bonded using a wire-bond tool (not shown) to selected bond pads on a front-side surface of the IC die 36. Afterward, the clamp block 30 is moved away from the LOC lead frame 34 by the actuating mechanism (not shown).

Figure 2B:
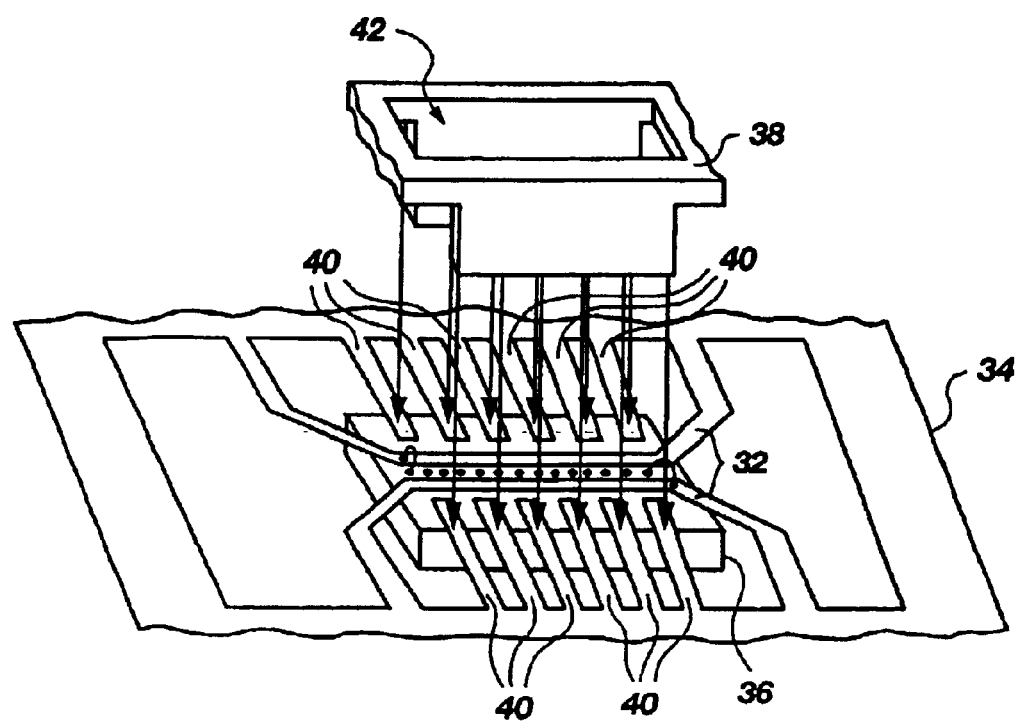

As shown in FIG. 2B, the bus bar LOC leads 32 of the LOC lead frame 34 have been wire-bonded to bond pads on the IC die 36 while being clamped as described above and the clamp block 30 (FIG. 2A) has been moved away from the LOC lead frame 34. Another portion of the clamp mechanism of FIG. 2A includes a clamp block 38 moving as directed by the actuating mechanism (not shown) of FIG. 2A to fixedly hold non-bus bar LOC leads 40 of the LOC lead frame 34 against the IC die 36. Once the leads 40 are fixedly held by the clamp block 38, they may be wire-bonded through a bonding aperture 42 in the clamp block 38 to bond pads on the front-side surface of the IC die 36 using the wire-bond tool (not shown) of FIG. 2A.

By clamping the bus bar LOC leads 32 and non-bus bar LOC leads 40 of the LOC lead frame 34 at different times in accordance with the present invention, the bus bar LOC leads 32 interposed between bond pads on the front-side surface of the IC die 36 and the non-bus bar LOC leads 40 can be fully clamped while they are wire-bonded. This is in contrast to the conventional clamping method described above which would only clamp the LOC leads 32 and 40 of the LOC lead frame 34 once, and thus would not fully clamp the bus bar LOC leads 32, since to do so while also clamping the non-bus bar LOC leads 40 would interfere with the wire-bonding of the non-bus bar LOC leads 40.

It will be understood that the clamp mechanism of FIGS. 2A and 2B may take a variety of forms, and that the present invention includes within its scope all clamp mechanisms capable of clamping the LOC leads of an LOC lead frame in sets, one set at a time and in any order. It will also be understood that the clamp mechanism may comprise a variety of clamp members, including, for example, one or more clamp blocks, as shown in FIGS. 2A and 2B, or one or more clamp fingers, as described below with respect to FIG. 3B. It will further be understood that the clamp mechanism may include one or more clamp members for clamping each set of LOC leads in a LOC lead frame, and that each of the clamp members may individually clamp one or several LOC leads in the set. Further, it will be understood that the present invention includes within its scope: clamp mechanisms that clamp all the sets of LOC leads of a LOC lead frame at different times but at the same clamping location, as shown in FIGS. 2A and 2B; clamp mechanisms, such as that shown in FIGS. 1A and 1B, that clamp the sets of leads of a lead frame at different times and at different clamping locations; and any combination thereof.

Figure 3A:
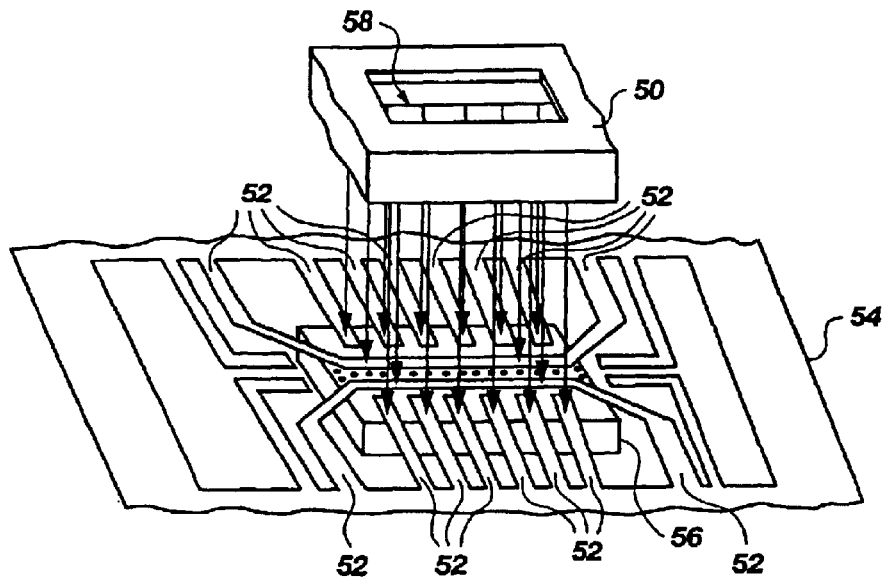
FIGS. 3A and 3B are isometric views of a partial LOC lead frame clamped and wire-bonded to an IC die in accordance with a further embodiment of the present invention.

As shown in FIG. 3A, a portion of a clamp mechanism in accordance with a further embodiment of the present invention includes a clamp block 50 moving as directed by an actuating mechanism (not shown) in a wire-bonding machine (not shown) to fixedly hold LOC leads 52 of a partial LOC lead frame 54 against an IC die 56 attached to the partial LOC lead frame 54 and supported by a heat block or other base (not shown). Once the LOC leads 52 are fixedly held (i.e., clamped) by the clamp block 50, they may be wire-bonded through a bonding aperture 58 in the clamp block 50 to selected bond pads on a front-side surface of the IC die 56 using a wire-bond tool (not shown).

Figure 3B:
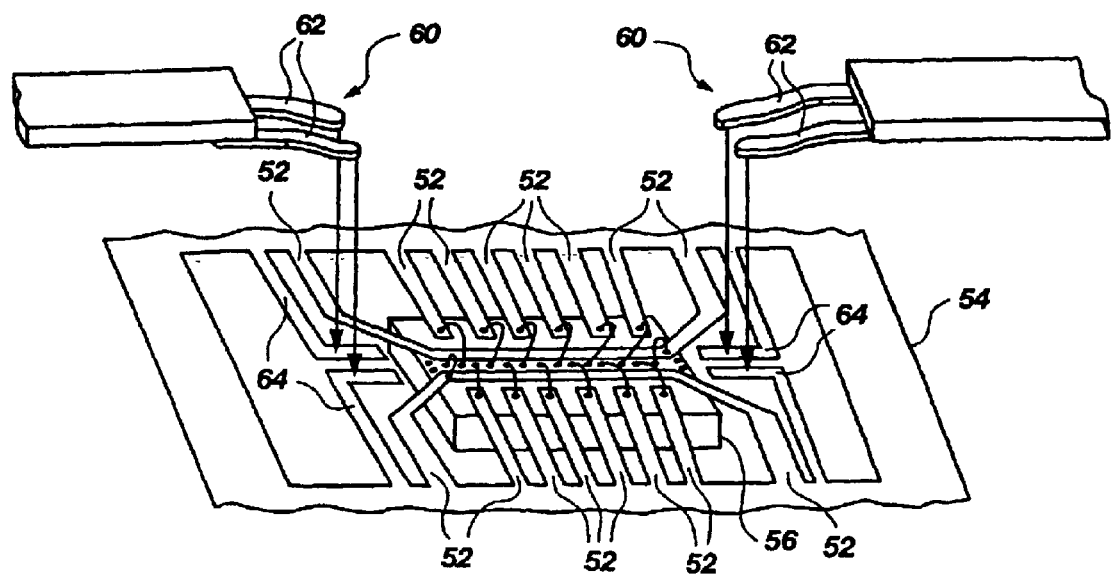

As shown in FIG. 3B, the LOC leads 52 of the partial LOC lead frame 54 have been wire-bonded to bond pads on the IC die 56 while being clamped as described above and the partial LOC lead frame 54 has been indexed to a new clamping location with respect to the clamp mechanism of FIG. 3A. Another portion 60 of the clamp mechanism of FIG. 3A includes clamp fingers 62 moving together as directed by the actuating mechanism (not shown) of FIG. 3A to fixedly hold non-LOC leads 64 of the partial LOC lead frame 54 against the heat block or other base (not shown) in a different plane than the plane of the front-side surface of the IC die 56. Once the non-LOC leads 64 are fixedly held by the clamp fingers 62, they may be wire-bonded using a wire-bond tool (not shown) to bond pads on the front-side surface of the IC die 56.

By clamping the LOC leads 52 and non-LOC leads 64 of the partial LOC lead frame 54 at different times in accordance with the present invention, the LOC leads 52 and the non-LOC leads 64 can be fully clamped while they are wire-bonded despite being clamped in different planes. This is in contrast to the conventional clamping method described above which would clamp the LOC leads 52 and the non-LOC leads 64 at the same time, and thus may fail to fully clamp some of the leads 52 and 64.

It will be understood that the clamp mechanism of FIGS. 3A and 3B may take a variety of forms, and that the present invention includes within its scope all clamp mechanisms capable of clamping the leads of a partial LOC lead frame in sets, one set at a time and in any order. It will also be understood that the clamp mechanism may comprise a variety of clamp members, including, for example, one or more clamp blocks, as shown in FIG. 3A, or one or more clamp fingers, as shown in FIG. 3B. It will further be understood that the clamp mechanism may include one or more clamp members for clamping each set of leads in a partial LOC lead frame, and that each of the plurality of clamp members may individually clamp one or several leads in the set. Further, it will be understood that the present invention includes within its scope: clamp mechanisms that clamp all the sets of leads of a partial LOC lead frame at different times but at the same clamping location; clamp mechanisms, such as that shown in FIGS. 3A and 3B, that clamp the sets of leads of a lead frame at different times and at different clamping locations; and any combination thereof.

Figure 4A:
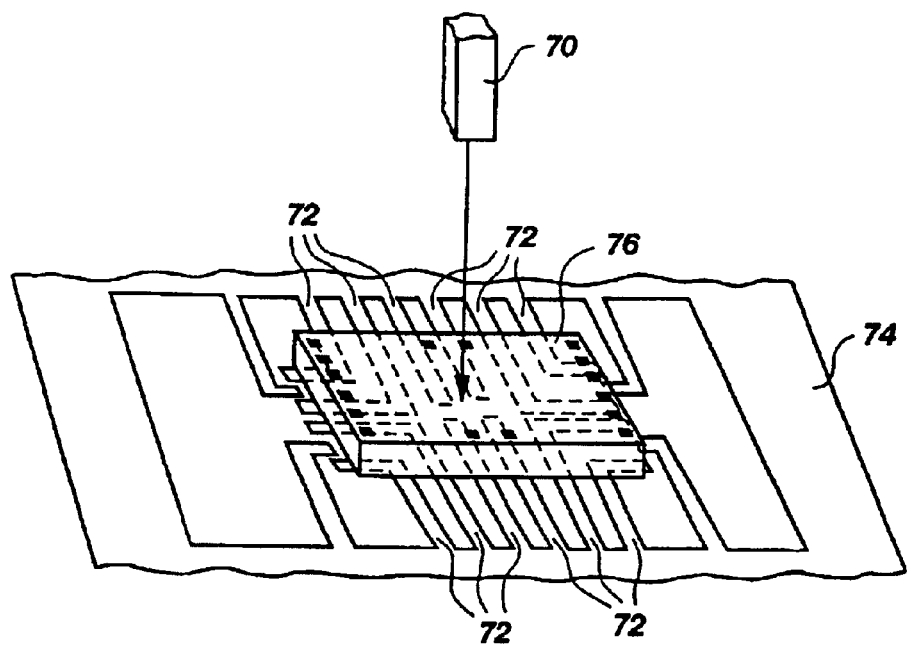
FIGS. 4A and 4B are isometric views of a Tape-Under-Frame (TUF) lead frame clamped and wire-bonded to an IC die in accordance with an additional embodiment of the present invention.

As shown in FIG. 4A, a portion of a clamp mechanism in accordance with an additional embodiment of the present invention includes a clamp block 70 moving as directed by an actuating mechanism (not shown) in a wire-bonding machine (not shown) to fixedly hold Tape-Under-Frame (TUF) leads 72 of a TUF lead frame 74 against a heat block or other base (not shown) by pressing against the front-side surface of an IC die 76 attached to the TUF lead frame 74. Once the TUF leads 72 are fixedly held (i.e., clamped) by the clamp block 70, they may be wire-bonded to selected bond pads on the front-side surface of the IC die 76 using a wire-bond tool (not shown).

Figure 4B:
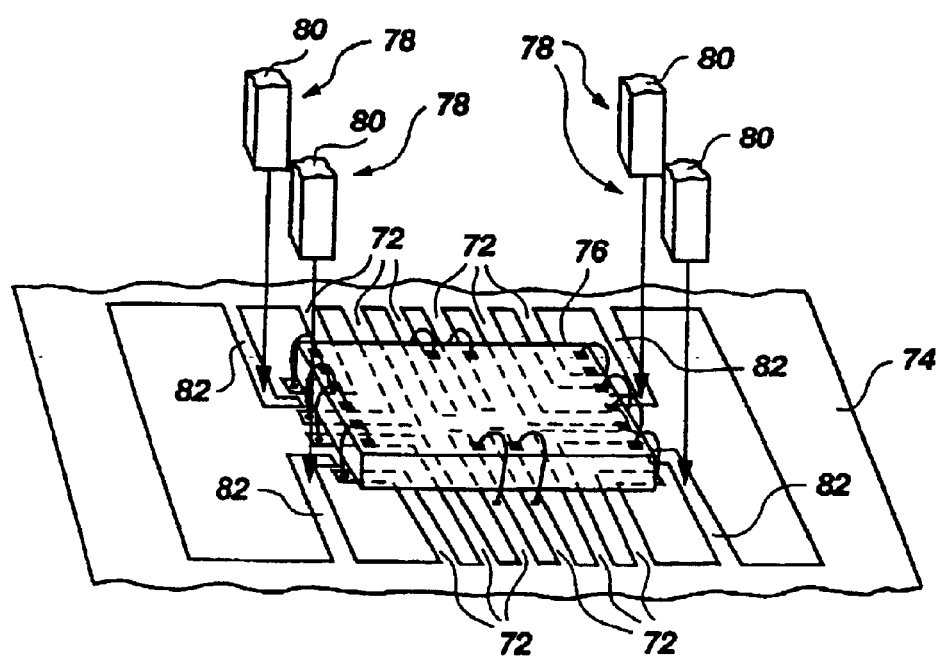

As shown in FIG. 4B, the TUF leads 72 of the TUF lead frame 74 have been wire-bonded to bond pads on the IC die 76 while being clamped as described above and the TUF lead frame 74 has been indexed to a new clamping location with respect to the clamp mechanism of FIG. 4A. Another portion 78 of the clamp mechanism of FIG. 4A includes clamp blocks 80 moving together as directed by the actuating mechanism (not shown) of FIG. 4A to fixedly hold non-TUF leads 82 of the TUF lead frame 74 against the heat block or other base (not shown). Once the non-TUF leads 82 are fixedly held by the clamp blocks 80, they may be wire-bonded using a wire-bond tool (not shown) to bond pads on the front-side surface of the IC die 76.

By clamping the TUF leads 72 and non-TUF leads 82 of the TUF lead frame 74 at different times in accordance with the present invention, both sets of leads 72 and 82 can be fully clamped while they are wire-bonded despite being clamped in different planes. This is in contrast to the conventional clamping method described above which would clamp the TUF leads 72 and the non-TUF leads 82 at the same time, and thus may fail to fully clamp some of the leads 72 and 82.

It will be understood that the clamp mechanism of FIGS. 4A and 4B may take a variety of forms, and that the present invention includes within its scope all clamp mechanisms capable of clamping the leads of a TUF lead frame in sets, one set at a time and in any order. It will also be understood that the clamp mechanism may comprise a variety of clamp members, including, for example, one or more clamp blocks, as shown in FIGS. 4A and 4B, or one or more clamp fingers, as shown in FIG. 3B. It will further be understood that the clamp mechanism may include one or more clamp members for clamping each set of leads in a TUF lead frame, and that each of the plurality of clamp members may individually clamp one or several leads in the set. Further, it will be understood that the present invention includes within its scope: clamp mechanisms that clamp all the sets of leads of a TUF lead frame at different times but at the same clamping location; clamp mechanisms, such as that shown in FIGS. 4A and 4B, that clamp the sets of leads of a lead frame at different times and at different clamping locations; and any combination thereof.

Figure 5A:
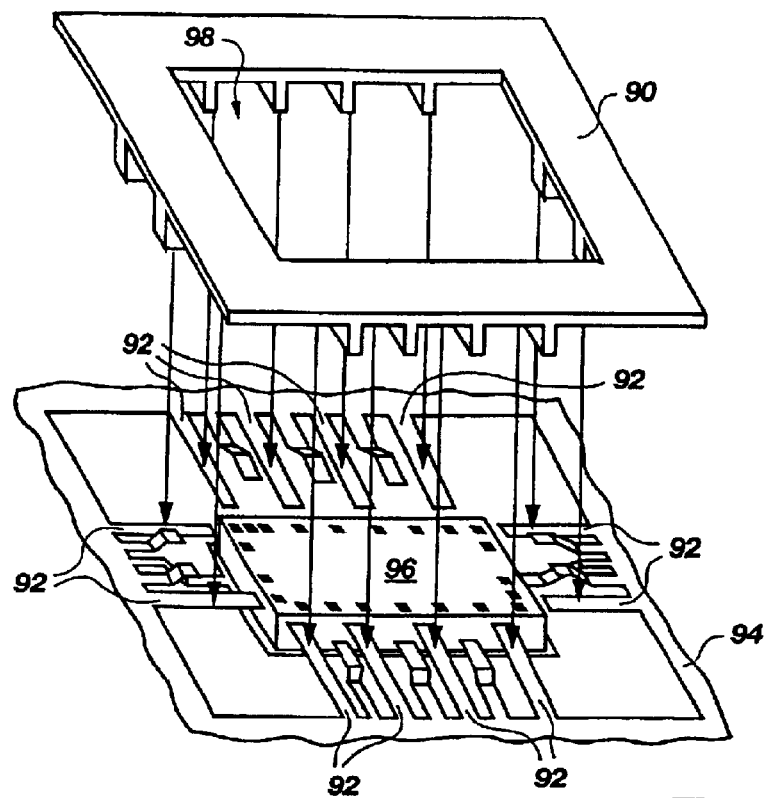
FIGS. 5A and 5B are isometric views of a single-piece, multi-level lead frame clamped and wire-bonded to an IC die in accordance with yet another embodiment of the present invention.

As shown in FIG. 5A, a portion of a clamp mechanism in accordance with yet another embodiment of the present invention includes a clamp block 90 moving as directed by an actuating mechanism (not shown) in a wire-bonding machine (not shown) to fixedly hold a first set of leads 92 of a multi-level lead frame 94 against a heat block or other base (not shown) beneath the multi-level lead frame 94. Once the leads 92 are fixedly held (i.e., clamped) by the clamp block 90, they may be wire-bonded with a wire-bond tool (not shown) inserted through a bonding aperture 98 in the clamp block 90 to selected bond pads on the front-side surface of an IC die 96 attached at its backside surface to the multi-level lead frame 94.

Figure 5B:
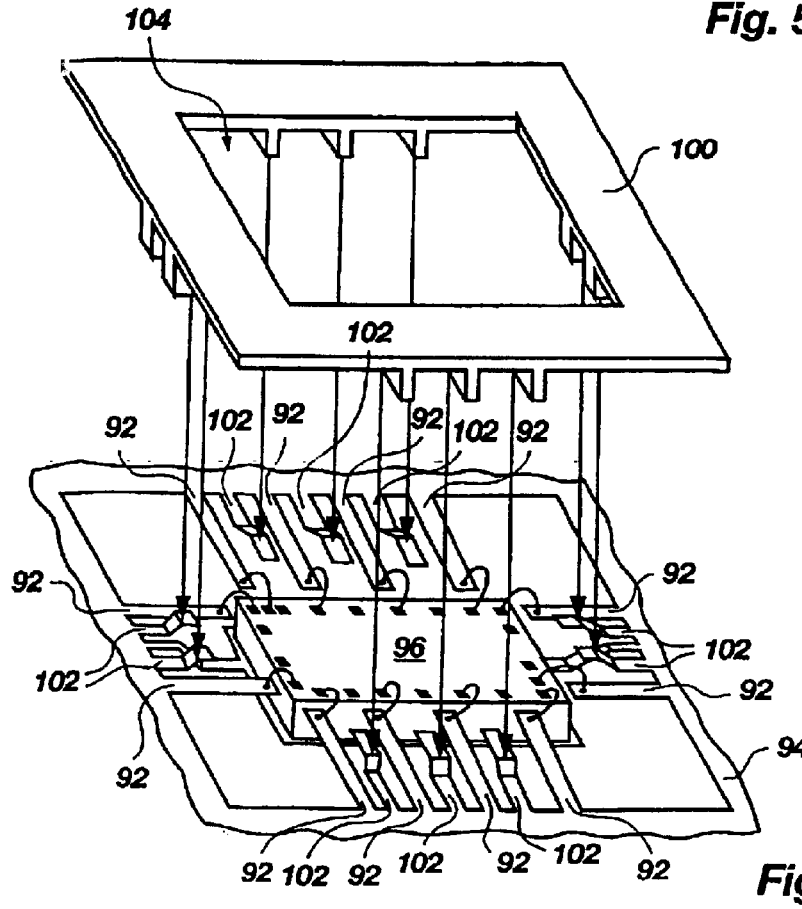

As shown in FIG. 5B, the leads 92 of the multi-level lead frame 94 have been wire-bonded to bond pads on the IC die 96 while being clamped as described above and the multi-level lead frame 94 has been indexed to a new clamping location with respect to the clamp mechanism of FIG. 5A. Another portion of the clamp mechanism of FIG. 5A includes a clamp block 100 moving as directed by the actuating mechanism (not shown) of FIG. 5A to fixedly hold a second set of leads 102 of the multi-level lead frame 94 against the heat block or other base (not shown). Once the leads 102 are fixedly held by the clamp block 100, they may be wire-bonded with a wire-bond tool (not shown) inserted through a bonding aperture 104 in the clamp block 100 to bond pads on the front-side surface of the IC die 96.

By clamping the first set of leads 92 and the second set of leads 102 of the multi-level lead frame 94 at different times in accordance with the present invention, both sets of leads 92 and 102 can be fully clamped while they are wire-bonded despite being clamped in different planes. This is in contrast to the conventional clamping method described above which would clamp the first set of leads 92 and the second set of leads 102 at the same time, and thus may fail to fully clamp some of the leads 92 and 102.

It will be understood that the clamp mechanism of FIGS. 5A and 5B may take a variety of forms, and that the present invention includes within its scope all clamp mechanisms capable of clamping the leads of a multi-level lead frame in sets, one set at a time and in any order. It will also be understood that the clamp mechanism may comprise a variety of clamp members, including, for example, one or more clamp blocks, as shown in FIGS. 5A and 5B, or one or more clamp fingers, as shown in FIG. 3B. It will further be understood that the clamp mechanism may include one or more clamp members for clamping each set of leads in a multilevel lead frame, and that each of the clamp members may individually clamp one or several leads in the set. Further, it will be understood that the present invention includes within its scope: clamp mechanisms that clamp all the sets of leads of a multi-level lead frame at different times but at the same clamping location; clamp mechanisms, such as that shown in FIGS. 5A and 5B, that clamp the sets of leads of a lead frame at different times and at different clamping locations; and any combination thereof.

Figure 6A:
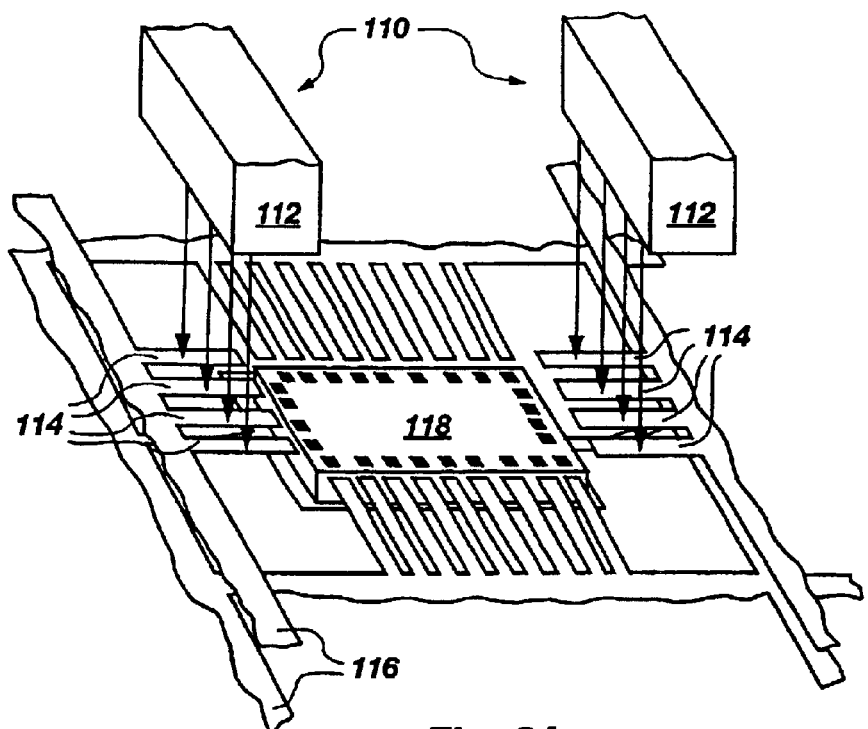
FIGS. 6A and 6B are isometric views of a two-piece, multi-level lead frame clamped and wire-bonded to an IC die in accordance with a still further embodiment of the present invention.

As shown in FIG. 6A, a portion 110 of a clamp mechanism in accordance with a still further embodiment of the present invention includes clamp blocks 112 moving as directed by an actuating mechanism (not shown) in a wire-bonding machine (not shown) to fixedly hold a first set of leads 114 of a multi-level, two-piece lead frame 116 against a heat block or other base (not shown) beneath the lead frame 116. Once the leads 114 are fixedly held (i.e., clamped) by the clamp blocks 112, they may be wire-bonded with a wire-bond tool (not shown) to selected bond pads on the front-side surface of an IC die 118 attached at its backside surface to the lead frame 116.

Figure 6B:
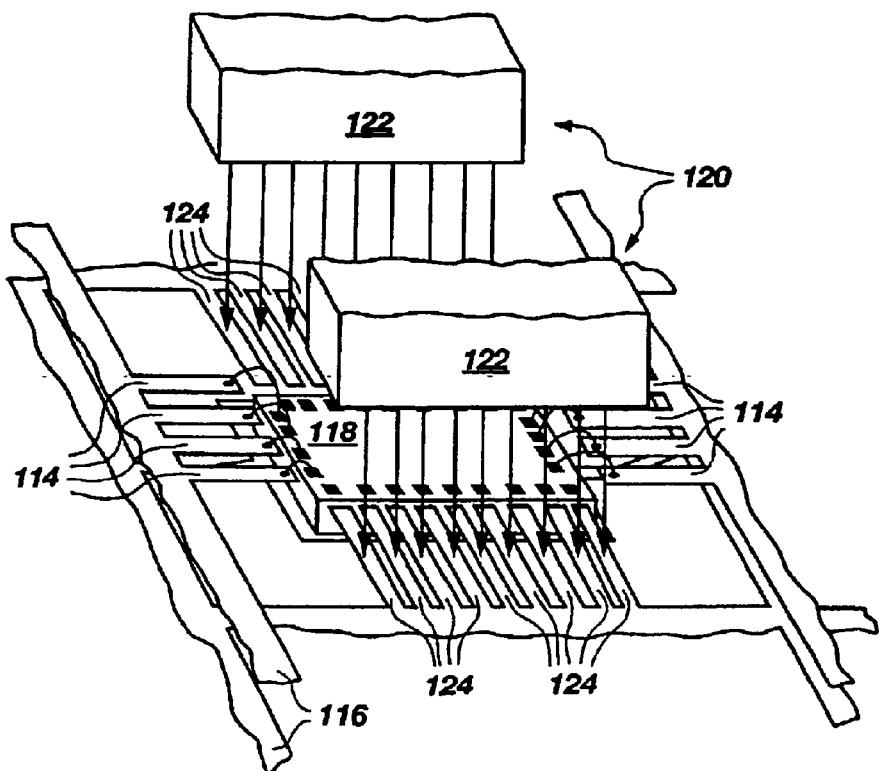

As shown in FIG. 6B, the leads 114 of the lead frame 116 have been wire-bonded to bond pads on the IC die 118 while being clamped as described above and the lead frame 116 has been indexed to a new clamping location with respect to the clamp mechanism of FIG. 6A. Another portion 120 of the clamp mechanism of FIG. 6A includes clamp blocks 122 moving as directed by the actuating mechanism (not shown) of FIG. 6A to fixedly hold a second set of leads 124 of the lead frame 116 against the heat block or other base (not shown). Once the leads 124 are fixedly held by the clamp blocks 122, they may be wire-bonded with a wire-bond tool (not shown) to bond pads on the front-side surface of the IC die 118.

By clamping the first set of leads 114 and the second set of leads 124 of the lead frame 116 at different times in accordance with the present invention, both sets of leads 114 and 124 can be fully clamped while they are wire-bonded despite being clamped in different planes. This is in contrast to the conventional clamping method described above which would clamp the first set of leads 114 and the second set of leads 124 at the same time, and thus may fail to fully clamp some of the leads 114 and 124.

It will be understood that the clamp mechanism of FIGS. 6A and 6B may take a variety of forms, and that the present invention includes within its scope all clamp mechanisms capable of clamping the leads of a multi-level, two-piece lead frame in sets, one set at a time and in any order. It will also be understood that the clamp mechanism may comprise a variety of clamp members, including, for example, one or more clamp blocks, as shown in FIGS. 6A and 6B, or one or more clamp fingers, as shown in FIG. 3B. It will further be understood that the clamp mechanism may include one or more clamp members for clamping each set of leads in a multi-level, two-piece lead frame, and that each of the clamp members may individually clamp one or several leads in the set. Further, it will be understood that the present invention includes within its scope: clamp mechanisms that clamp all the sets of leads of a multi-level lead frame at different times but at the same clamping location; clamp mechanisms, such as that shown in FIGS. 6A and 6B, that clamp the sets of leads of a lead frame at different times and at different clamping locations; and any combination thereof.

Figure 7A:
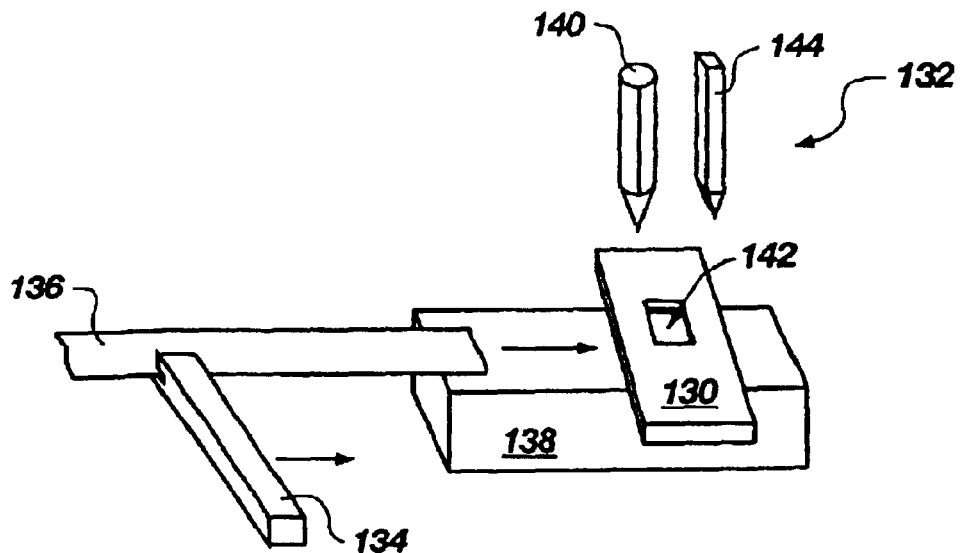
FIGS. 7A and 7B are isometric views of wire-bonding machines which incorporate the respective clamping embodiments of FIGS. 2A,2B and 5A,5B.

As shown in FIG. 7A, the clamp blocks 30 and 38 (not shown in FIG. 7A) of FIGS. 2A and 2B may be incorporated into a clamp mechanism 130 in a wire-bonding machine 132. An indexing mechanism 134 in the machine 132 sequentially indexes LOC lead frames in a lead frame strip 136 to a contact area on a heat block 138. While positioned proximate the contact area, each LOC lead frame in the lead frame strip 136 is clamped using the clamp blocks 30 and 38 (not shown in FIG. 7A) of FIGS. 2A and 2B as described above and is wire-bonded as described above using a wire-bonding tool 140 inserted through a bonding window 142 in the clamp mechanism 130.

Also, a wire-bond test device 144, such as a pull test device or a shear test device, inserted through the bonding window 142 during wire-bonding tests completed wire-bonds once the wire-bonding tool 140 moves on to other bonding sites.

It will be understood by those having skill in the field of this invention that a wide variety of indexing mechanisms and heat blocks will work for purposes of this invention. It will also be understood that the bonding machine 132 of FIG. 7A will work with any clamp mechanism capable of clamping the leads of a lead frame in sets, one set at a time. Further, it will be understood that the wire-bonding tool 140 may comprise one or more bonding tools, including, for example, ultrasonic, thermosonic, and thermo-compression bonding tools.

Figure 7B:
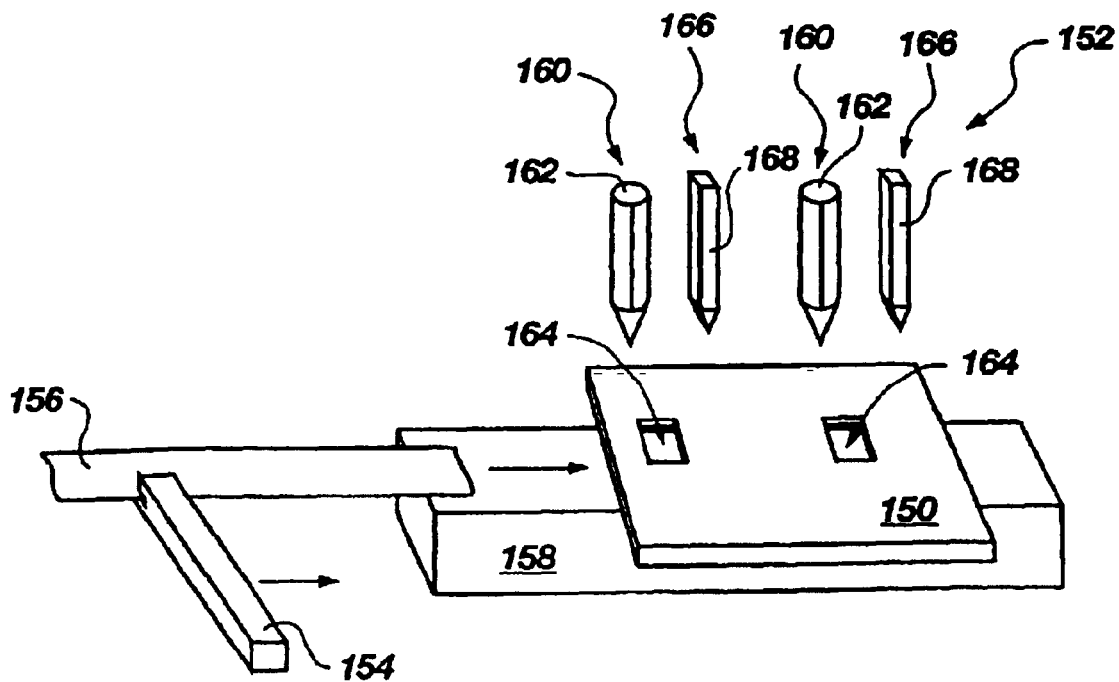

As shown in FIG. 7B, the clamp blocks 90 and 100 (not shown in FIG. 7B) of FIGS. 5A and 5B may be incorporated into a clamp mechanism 150 in a wire-bonding machine 152. An indexing mechanism 154 in the machine 152 indexes lead frames in a lead frame strip 156 in turn to each of a pair of contact areas on a heat block 158. While positioned proximate the contact areas, each lead frame in the lead frame strip 156 is clamped using the clamp blocks 90 and 100 (not shown in FIG. 7B) of FIGS. 5A and 5B as described above and is wire-bonded as described above using a wire-bonding tool system 160 including a pair of wire-bonding tools 162 inserted through bonding windows 164 in the clamp mechanism 150.

Also, a wire-bond test device system 166 including wire-bond test devices 168, such as pull test devices or shear test devices, inserted through the bonding windows 164 during wire-bonding tests completed wire-bonds once the wire-bonding tools 162 move on to other bonding sites.

It will be understood by those having skill in the field of this invention that a wide variety of indexing mechanisms and heat blocks will work for purposes of this invention. It will also be understood that the bonding machine 152 of FIG. 7B will work with any clamp mechanism capable of clamping the leads of a lead frame in sets, one set at a time. Further, it will be understood that the wire-bonding tools 162 may comprise any bonding tools, including, for example, ultrasonic, thermosonic, and thermo-compression bonding tools.

Although the present invention has been described with reference to particular embodiments, the invention is not limited to these embodiments. Rather, the invention is limited only by the appended claims, which include within their scope all equivalent devices or methods that operate according to the principles of the invention as described.

What is claimed is:

1. A wire bonding method for a wire bonding apparatus, the wire bonding method for holding at least portions of a plurality of leads of a lead frame comprising clamping a plurality of at least three sets of the plurality of leads of the lead frame, one set of leads at a time, with each set of the plurality of sets of the plurality of leads of the lead frame including fewer than all the leads of the plurality of leads of the lead frame, at least one set of leads of the plurality of sets of the plurality of leads of the lead frame including more than one of the leads, and at least one set of leads of the plurality of sets of the plurality of leads being clamped on a different plane than at least one other set of leads of the plurality of leads.

2. The wire bonding method of claim 1, wherein the clamping the one set of leads at a time comprises holding the one set of leads at a time against a heat block.

3. A wire bonding method for a wire bonding apparatus, the wire bonding method for wire-bonding a plurality of leads of each lead frame of a plurality of lead frames in a lead frame strip to bond pads on integrated circuit dice connected to the plurality of lead frames, the method comprising:

moving each lead frame of the plurality of lead frames in the lead frame strip to a position;

clamping a plurality of at least three sets of the plurality of leads of each lead frame at the position, one set at a time, having each set of the leads of the plurality of at least three sets including fewer than all of the leads of each lead frame, at least one set including more than one lead of the plurality of leads of each lead frame and at least one set of the plurality of leads being clamped on a different plane than at least one other set of the plurality of leads; and forming wire-bonds between portions of the at least one set of the plurality of leads to portions of the bond pads on the integrated circuit dice connected to the lead frames.

4. The wire bonding method of claim 3, further comprising:

testing wire-bonds of the plurality of leads of each of the lead frames at the position.

5. The wire bonding method of claim 4, wherein the testing wire-bonds comprises at least one of pull testing and shear testing the wire-bonds.

6. The wire bonding method of claim 3, wherein the forming wire-bonds comprises wire-bonding each set of the leads at the position using a bonding method selected from a group comprising ultrasonic bonding, thermosonic bonding, and thermo-compression bonding.

7. A method for clamping a plurality of leads of a lead frame, each lead having a wire bonding region thereof, the method comprising:

determining a distance between the wire bonding region of at least two leads of the plurality of leads and a center portion of the lead frame;

subdividing the plurality of leads into at least two sets of leads based on a distance between their respective wire bonding regions and the center portion of the lead frame; and clamping each set of leads, one set of leads at a time.

8. The method of claim 7, wherein the lead frame includes bus bars and one set of leads includes solely bus bars.

9. The method of claim 8, wherein the one set of leads including solely the bus bars is clamped first.

10. The method of claim 7, wherein the clamping each set of leads, one set of leads at a time, further comprises clamping each set of leads, one set at a time, in an order according to which set of leads has a shortest distance between the wire bonding region and the center portion of the lead frame.

11. A method of clamping at least two leads of a plurality of leads of a lead frame, at least one lead lying in a different plane than at least one other lead, the method comprising:

determining a plane of at least two sets of leads of the plurality of leads in which at least one lead of the at least two sets of leads lies;

subdividing the plurality of leads into the at least two sets of leads with respect to the plane in which the at least one lead of the at least two sets of leads lies; and clamping each set of leads, one set of leads at a time.

12. The method of claim 11, wherein the plurality of leads includes leads-over-chip type leads and wherein the subdividing the plurality of leads includes creating a set of leads including only the leads-over-chip type leads.

13. The method of claim 12, wherein the clamping each set of leads, one set of leads at a time, further includes clamping the set of leads-over-chip type leads first.

14. The method of claim 11, wherein the plurality of leads includes tape-under-frame type leads and wherein the subdividing the plurality of leads includes creating a set of leads including only the tape-under-frame type leads.

15. The method of claim 14, wherein the clamping each set of leads, one set of leads at a time, further includes clamping the set of tape-under-frame type leads first.

16. A method for connecting a plurality of leads of lead frames in a lead frame strip to at least one bond pad of a plurality of bond pads on integrated circuit dice attached to the lead frames, the method comprising:

positioning each lead frame in the lead frame strip at a position;

clamping a plurality of at least two sets of leads of the plurality of leads of each of the lead frames indexed to the position, one set at a time, with each set of leads including fewer than all of the leads of each lead frame and at least one set of leads including more than one of the leads of each lead frame;

forming wire-bonds between at least one lead of each of the sets of clamped leads to the at least one bond pad of the plurality of bond pads on the integrated circuit dice attached to the lead frame of the clamped leads; and testing at least one wire-bond between the at least one lead of each of the lead frames at the position and the bond pads of the integrated circuit dice while other leads of the lead frame are clamped.

17. The method of claim 16, wherein the testing at least one wire-bond comprises at least one of pull testing and shear testing wire-bonds.

* * * * *